United States Patent
Blomqvist

(10) Patent No.: US 9,829,318 B2
(45) Date of Patent: Nov. 28, 2017

(54) GYROSCOPE STRUCTURE AND GYROSCOPE DEVICE

(71) Applicant: MURATA MANUFACTURING CO., LTD., Nagaokakyo-shi, Kyoto (FI)

(72) Inventor: Anssi Blomqvist, Helsinki (FI)

(73) Assignee: MURATA MANUFACTURING CO., LTD., Nagaokakyo-Shi, Kyoto (JP)

(*) Notice: Subject to any disclaimer, the term of this patent is extended or adjusted under 35 U.S.C. 154(b) by 223 days.

(21) Appl. No.: 14/694,208

(22) Filed: Apr. 23, 2015

(65) Prior Publication Data
US 2015/0323323 A1 Nov. 12, 2015

(30) Foreign Application Priority Data

May 7, 2014 (FI) ...................................... 20145413

(51) Int. Cl.
*G01C 19/00* (2013.01)
*G01C 19/5762* (2012.01)
(Continued)

(52) U.S. Cl.
CPC ..... *G01C 19/5762* (2013.01); *G01C 19/5712* (2013.01); *G01C 19/5747* (2013.01); *B81B 2201/0242* (2013.01); *B81B 2201/033* (2013.01)

(58) Field of Classification Search
CPC ............ G01C 19/5612; G01C 19/5705; G01C 19/5712; G01C 19/5719; G01C 19/574;
(Continued)

(56) References Cited

U.S. PATENT DOCUMENTS

| 2007/0131030 A1 | 6/2007 | Jeong et al. |
| 2010/0095769 A1 | 4/2010 | Matsumoto et al. |
| 2010/0281977 A1 | 11/2010 | Coronato et al. |
| 2011/0094302 A1 | 4/2011 | Schofield et al. |
| 2011/0132087 A1* | 6/2011 | Ohms ................ G01C 19/5747 73/504.12 |

(Continued)

FOREIGN PATENT DOCUMENTS

| JP | 2004-301575 A | 10/2004 |
| JP | 2011-053185 A | 3/2011 |

(Continued)

OTHER PUBLICATIONS

Finnish Search Report dated Jan. 7, 2015 corresponding to Finnish Patent Application No. 20145413.
(Continued)

*Primary Examiner* — Benjamin Schmitt
(74) *Attorney, Agent, or Firm* — Squire Patton Boggs (US) LLP

(57) ABSTRACT

A microelectromechanical gyroscope structure for detecting angular motion about an axis of angular motion. A drive element is suspended for one-dimensional motion in a direction of a drive axis, and a sense body carries one or more sense rotor electrodes and is coupled to the drive element with a first directional spring structure that forces the sense body to move with the drive element and has a preferred direction of motion in a direction of a sense axis. The drive element includes an actuation body and a drive frame wherein the first spring structure couples the sense body directionally to the drive frame, and a second directional spring structure that couples the drive frame to the actuation body and has a preferred direction of motion in the direction of the sense axis.

20 Claims, 4 Drawing Sheets

(51) Int. Cl.
*G01C 19/5712* (2012.01)
*G01C 19/5747* (2012.01)

(58) Field of Classification Search
CPC ............ G01C 19/5747; G01C 19/5762; B81B 2201/033; B81B 2201/0242
USPC ......................................... 73/504.02, 504.12
See application file for complete search history.

(56) References Cited

U.S. PATENT DOCUMENTS

| | | |
|---|---|---|
| 2011/0232384 A1 | 9/2011 | Akashi et al. |
| 2012/0060604 A1 | 3/2012 | Neul et al. |
| 2012/0222483 A1 | 9/2012 | Blomqvist et al. |

FOREIGN PATENT DOCUMENTS

| | | |
|---|---|---|
| JP | 2011-203086 A | 10/2011 |
| JP | 2013-181861 A | 9/2013 |
| JP | 2014-510271 | 4/2014 |
| WO | 2008/032415 A1 | 3/2008 |

OTHER PUBLICATIONS

International Search Report application No. PCT/IB2015/053295 dated Aug. 25, 2015.
Search Report for corresponding Taiwanese Patent Application No. 104113658, dated Apr. 10, 2017.
Japanese Office Action corresponding to Patent Appln. No. 2016-562237, dated Aug. 18, 2017.

\* cited by examiner

GYROSCOPE STRUCTURE AND GYROSCOPE DEVICE

BACKGROUND

Field

The present invention relates to microelectromechanical devices and especially to a microelectromechanical gyroscope structure and a gyroscope device, as defined in the preambles of the independent claims.

Description of the Related Art

Microelectromechanical structures can be applied to quickly and accurately detect very small changes in physical properties. For example, a microelectromechanical gyroscope can be applied to quickly and accurately detect very small angular displacements. Motion has six degrees of freedom: translations in three orthogonal directions and rotations around three orthogonal axes. The latter three may be measured by an angular rate sensor, also known as a gyroscope. Microelectromechanical gyroscopes use the Coriolis Effect to measure the angular rate. When a mass is moving in one direction and rotational angular velocity is applied, the mass experiences a force in orthogonal direction as a result of the Coriolis force. The resulting physical displacement caused by the Coriolis force may then be read from, for example, a capacitively, piezoelectrically or piezoresistively sensing structure.

In MEMS gyros the primary motion is typically not continuous rotation as in conventional ones due to lack of adequate bearings. Instead, mechanical oscillation may be used as the primary motion. When an oscillating gyroscope is subjected to an angular motion orthogonal to the direction of the primary motion, an undulating Coriolis force results. This creates a secondary oscillation orthogonal to the primary motion and to the axis of the angular motion, and at the frequency of the primary oscillation. The amplitude of this coupled oscillation can be used as the measure of the angular rate.

Gyroscopes are very complex inertial MEMS sensors. The basic challenge in gyroscope designs is that the Coriolis force is very small and therefore the generated signals tend to be minuscule compared to other electrical signals present in the gyroscope. The design of a gyroscope structure layer is typically optimized to provide advantage in at least one aspect, for example, in size of the inertial mass, the use of component surface area, complexity of the structure and vulnerability to changes in ambient conditions, especially to changes in temperature. However, at the same time, at least one of these advantages is typically compromised.

SUMMARY

An object of certain embodiments of the present invention is to provide a structurally optimized gyroscope design in which effects of changes in external conditions are minimized.

In certain embodiments, the invention includes a microelectromechanical gyroscope structure for detecting angular motion about an axis of angular motion. The structure includes a drive element suspended for one-dimensional motion in a direction of a drive axis, wherein the drive axis is orthogonal to the axis of angular motion. The structure also includes a sense body that carries one or more sense rotor electrodes and is coupled to the drive element with a first directional spring structure that forces the sense body to move with the drive element and has a preferred direction of motion in a direction of a sense axis, wherein the sense axis is orthogonal to the axis of angular motion and the drive axis. The drive element includes an actuation body and a drive frame wherein the first spring structure couples the sense body directionally to the drive frame, and a second directional spring structure that couples the drive frame to the actuation body and has a preferred direction of motion in the direction of the sense axis. The actuation body carries one or more drive electrodes and is coupled to one or more first anchor points with a third directional spring structure that has a preferred direction of motion in the direction of the drive axis. The drive element is coupled to one or more second anchor points with a fourth spring structure that has a preferred direction of motion in the direction of the drive axis.

Further advantages of embodiments of the invention are discussed in more detail with the following embodiments.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of various embodiments of the invention will be described with a simple example of a device architecture in which various embodiments of the invention may be implemented. Only elements relevant for illustrating the embodiments are described in detail. Various implementations of gyroscope structures that are generally known to a person skilled in the art may not be specifically described herein.

Figure 1:
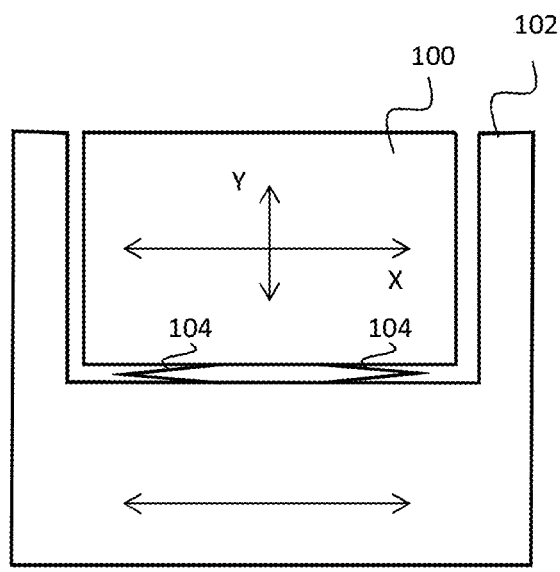
FIG. 1 shows a top view to a part of a planar structure layer of a MEMS gyroscope device.

FIG. 1 describes some basic elements of a gyroscope structure. FIG. 1 shows a top view to a part of a planar structure layer of a MEMS gyroscope device. The MEMS structure layer may be manufactured by patterning or etching structures on or into a substrate wafer, a silicon-on-insulator wafer or a cavity-silicon-on-insulator wafer. Manufacturing methods of MEMS structures are well known to a person skilled in the art and will not be elaborated here in more detail. The structure layer is shown to include a sense body 100. The term sense body 100 refers here to a structural element that includes a seismic mass element suspended by one or more spring structures to provide an inertial movement in two perpendicular directions X, Y in the plane of the structure layer. Direction X represents here the direction of an in-plane primary motion, and direction Y an in-plane direction of the secondary motion of the gyroscope. The primary motion refers here to vibratory motion induced by one or more electromechanical transducers. The secondary motion refers here to vibratory motion induced by Coriolis force resulting from an applied angular motion. The resulting physical displacement of the sense body may be read capacitively with sense rotor electrodes carried by the sense body 100.

Figure 2:
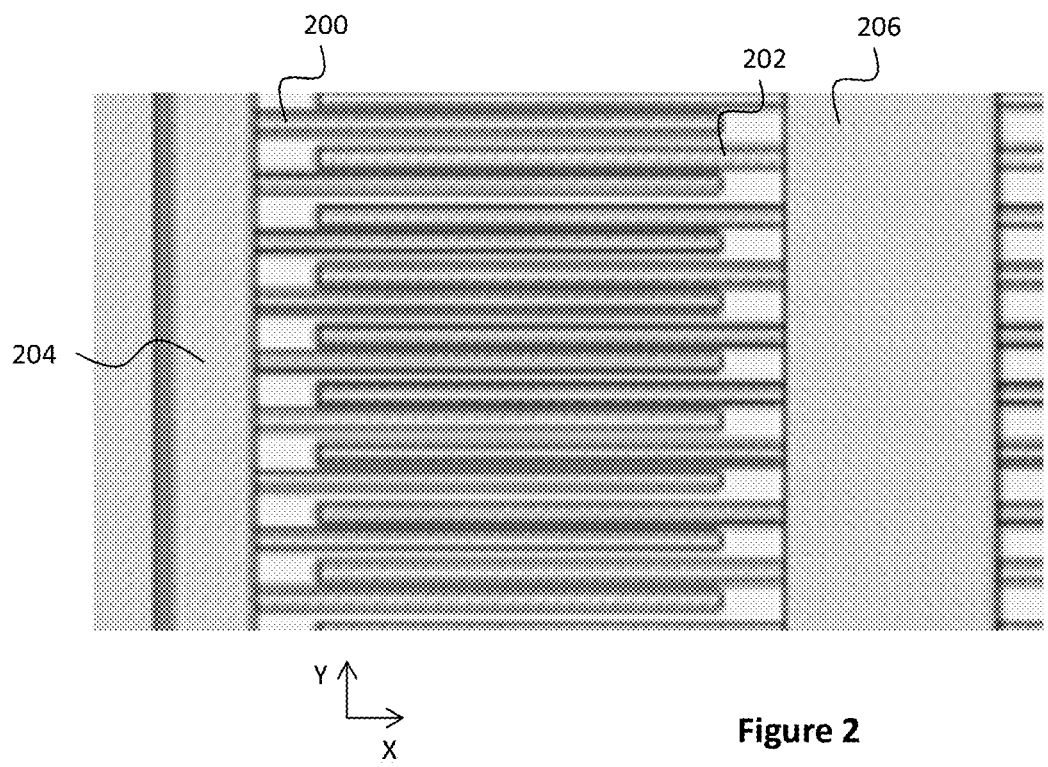
FIG. 2 illustrates sense electrodes carried by a sense body.

FIG. 2 illustrates an exemplary structure for sense rotor electrodes 200 carried by the sense body 100. A carried sense rotor electrode 200 refers here to a conductive element rigidly coupled to or integrated into the sense body such that it moves along any motion of it. One or more rotor sense electrodes 200 form a rotor that is made to electrically interact with a stator. The stator is provided by one or more anchored sense stator electrodes 202. In the configuration of FIG. 2, the sense rotor electrodes 200 and sense stator electrodes 202 are adapted to form separate comb frames. The sense rotor combs 204 and sense stator combs 206 are interlaced such that comb fingers adjacent to a sense rotor finger belong to a sense stator comb 206, and comb fingers adjacent to a sense stator finger belong to a sense rotor comb 204. In the primary motion the sense rotor comb 204 moves back and forth in the X direction in the plane of the structure layer. In the secondary motion the sense rotor comb 204 moves back and forth in the Y direction and in the plane of the structure layer when subjected to applied angular motion about an out-of-plane axis Z (not shown) orthogonal to the X and Y directions. It is noted that the configuration of FIG. 2 is exemplary only. The vibratory motion may be sensed with different types of carried electrodes and electrode combs (linear, parallel plate, or hybrid), depending on the overall optimization of the gyroscope structure.

Figure 3:
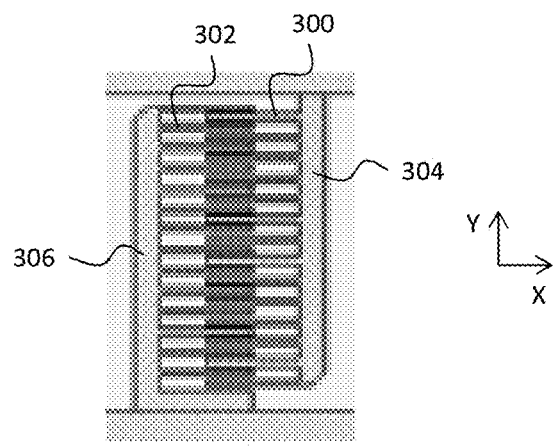
FIG. 3 illustrates drive electrodes of the drive element.

Returning back to FIG. 1, the sense body 100 is coupled to a drive element 102. The drive element 102 refers here to a structural element that carries drive electrodes through which the drive element may be actuated to primary motion. FIG. 3 illustrates an exemplary structure for drive electrodes 300 of the drive element. Also in the configuration of FIG. 3, the carried drive rotor electrodes 300 and drive stator electrodes 302 are adapted to form comb frames where drive rotor combs 304 and drive stator combs 306 are interlaced such that comb fingers adjacent to a drive rotor finger belong to a drive stator comb 306, and comb fingers adjacent to a drive stator finger belong to a drive rotor comb 304. Also the configuration of FIG. 3 is exemplary only. The vibratory primary motion may be induced with different types of carried electrodes and electrode combs (linear, parallel plate, or hybrid), depending on the overall optimization of the gyroscope structure.

Returning back to FIG. 1, the drive element 102 is coupled to the sense body with a first directional spring structure 104. A directional spring structure refers here to a combination of one or more springs that alone or in combination provide a preferred direction of motion, i.e. deflect (have a low spring constant) in one direction and are rigid (have significantly higher spring constant) in other directions. The ratio of the spring constant of a directional spring in the deflection direction to the spring constant in the other directions is at least 1:10, typically of the order of 1:100-10000. The first directional spring structure 104 between the sense body 100 and the drive element 102 is adapted to deflect in Y direction and be rigid in other directions, including the X direction of the primary motion. Accordingly, the first directional spring structure 104 forces the sense body 100 to move with the actuated primary motion of the drive element 102 in the X direction, and allows the sense body to be moved by the Coriolis force in the Y direction. The suspension of the drive element 102 is also directional, and thus allows only one-dimensional motion in X direction in the plane of the structure layer.

It is easily understood that the design of the structure of FIG. 1 is very good because it provides a large inertial mass for the Coriolis force in a compact surface area and with simple suspension arrangements. However, in microelectromechanical gyroscopes, the dimensions are very small; the components may range in size from tens of micrometers to some millimeters. This imposes many challenges to the design. For example, thermal expansion in varying operating temperatures can change dimensions of the layer structure and cause significant variations to the measured values. The sensor structure and the associated electronics also need to be capsulated in a package. The package may include structures with a different thermal expansion coefficient than the structure layer. This tends to cause temperature dependent deformations, and thereby unpredictable errors to the measurements. The known frame-based structures show many different types of architectures where better mode decoupling has been achieved, but at the cost of compromising one or more of the basic advantages of the element design of FIG. 1.

Figure 4:
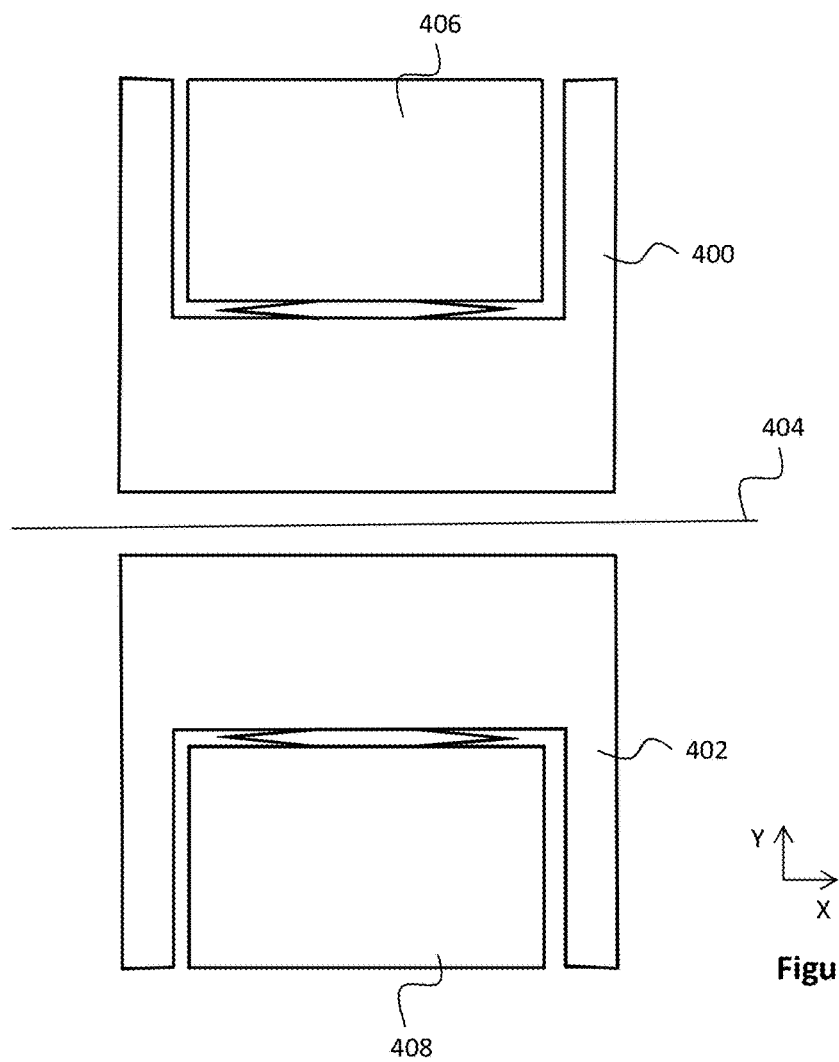
FIG. 4 illustrates a part of the layer structure that includes two layer elements.

The temperature dependency may be understood in more detail with the structure of FIG. 1 used in differential detection. For differential detection, the structure can be symmetrically doubled into the layer structure. FIG. 4 illustrates a part of the layer structure that includes two layer elements of FIG. 1. A first element 400 and a second element 402 are positioned symmetrically in respect of the symmetry axis 404 such that sense bodies 406, 408 are in the lateral ends of the structure elements. It has been detected that in these kind of structures, an important source of error is in temperature dependent package stresses that tend to displace the anchor points of the sense body and the anchor points of the drive frame in Y direction, towards the symmetry axis 404. As discussed, the structure of FIG. 1 is a good design, because anchoring for the rotor of the sense body suspension can be arranged to be close to the sense stator anchoring, i.e. the distance between anchoring of the rotor and anchoring of the stator of the sense body in the direction in Y direction is minimized. Structural changes arising from temperature variations have thus little effect to their mutual positioning.

However, actuation structures in the drive element require a large surface area so they cannot be positioned close to the sense elements in the structure layer. When the layer structure deforms with temperature variations, the anchor locations vary accordingly usually symmetrically with respect of symmetry axis, which causes uncontrolled temperature dependent errors to the measurements. For example, in the exemplary actuation structure of FIG. 3, temperature variations tend to deform gaps between the drive stator comb 306 fingers and drive rotor comb 304 fingers out of their designed symmetrical forms. This induces variable drive generated forces in the Y direction, and subsequently drift to the Coriolis force detection.

Figure 5:
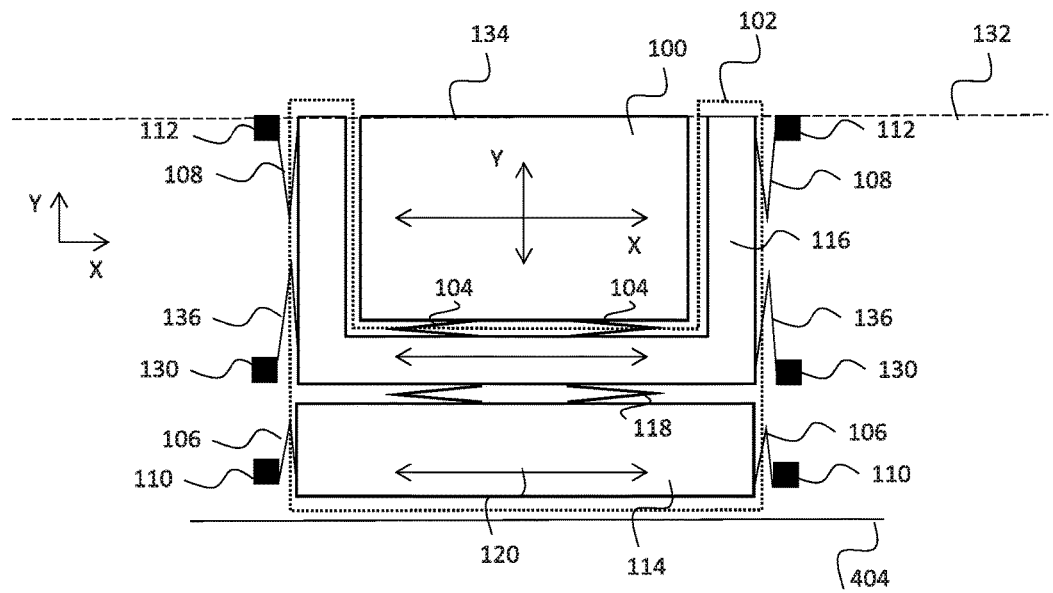
FIG. 5 illustrates a layer element of a layer structure.

Embodiments of the invention achieve the advantages of the structure layer design of FIG. 1 and at the same time efficiently avoid effects of temperature variations to the measurement results made with the gyroscope device. FIG. 5 illustrates part of a layer structure, where same reference numbers are applied to refer to elements already described in FIG. 1. The suspension of the sense body 100 and the drive element 102 is now shown to include spring structures 106, 108 coupled to anchor points 110, 112 that in a packaged gyroscope device become rigidly attached to a support layer. It has been detected that a specific positioning of the anchor points and the layer elements is required for accurate operability of the device.

The drive element 102 includes now an actuation body 114 and a drive frame 116. The first spring structure 104 couples the sense body 100 directionally to the drive frame 116. The first spring structure 104 is advantageously one-dimensional such that it deflects in the Y direction and rigidly opposes motion in other directions. Due to this, the first spring structure 104 forces the sense body 100 to move with X direction vibration of the drive frame 116, and thereby provides the primary motion for the sense body 100. The deflection of the first spring structure 104 in the Y direction allows the sense body to move is response to the Coriolis force and thereby allows detection of the applied angular motion.

The drive frame 116 is coupled to the actuation body 114 with a second directional spring structure 118. Advantageously, the second directional spring structure 118 can be one-dimensional such that it deflects in the Y direction and rigidly opposes motion in other directions. The actuation body 114 refers here to a rotor part of a structural actuation element that includes electromechanical transducers, the so-called drive motor, required to induce the primary oscillation. Accordingly, in the configuration of FIG. 5, the actuation body 114 carries the one or more drive rotor electrodes 300 of FIG. 3. In addition, the structural actuation element includes a stator part that includes the drive stator electrodes, for example the drive stator electrodes 302 of FIG. 3.

The actuation body 114 is suspended to first anchor points 110 with a third directional spring structure 106. The direction of the motion of the actuation body is typically by far dependent on its suspension. In FIG. 5, a pair of first anchor points 110 can be advantageously positioned to opposite sides of the actuation element 114 and the third spring structure 108 includes two directional springs oriented such that their deflection directions are aligned to a common axis, hereinafter referred to as a drive axis 120. In more general, the drive axis can be considered to correspond to an allowed direction of motion defined by suspension of the actuation body. Excitation applied through interaction of the drive rotor electrodes and drive stator electrodes thus results in vibratory oscillation of the actuation body 114 parallel to the direction of the drive axis 120.

On the other hand, the drive frame 116 is coupled to one or more second anchor points 112 with a fourth directional spring structure 108 that deflects in the direction of the drive axis 120 and opposes motion in other directions. In FIG. 5, a pair of second anchor points 112 is advantageously positioned to opposite sides of the drive frame 116 and the fourth spring structure 108 includes two directional springs oriented such that their deflection directions are aligned to a common axis that is parallel to the drive axis 120. The second directional spring structure 118 relays the vibratory oscillation of the actuation body 114 in the X direction to the drive frame 116, and the first directional spring structure 104 relays the vibratory oscillation of the drive frame 116 in the X direction to the sense body 100. The sense body is thereby induced into primary vibratory oscillation parallel to the direction of the drive axis 120.

As shown in FIG. 5, the structure layer may include more than one second anchor points which springs of the fourth directional spring structure couple to. For example, the structure of FIG. 5 includes two pairs of second anchor points 112, 130 with associated pairs of directional springs. One pair of anchor points 112 may be advantageously positioned close to anchoring structures of the stator of the sense body 100 in the Y direction. In FIG. 5, the anchoring of the stator of the sense element can be considered to be effectively in the lateral end (i.e. furthest from the symmetry axis 404) of the sense element. The anchor points in the associated pair of anchor points 112 have a symmetrical form, and the lateral edges of the anchor points 112 may be aligned to a line 132 that is parallel to the drive axis 120 and coincides with a lateral side edge 134 of the sense element. Directional suspension by the directional springs 108 and anchor points 112 may be strengthened by another pair of second anchor points 130 and associated directional springs 136, positioned closer to the symmetry axis 404 in the Y direction, as shown in FIG. 5.

Figure 6:
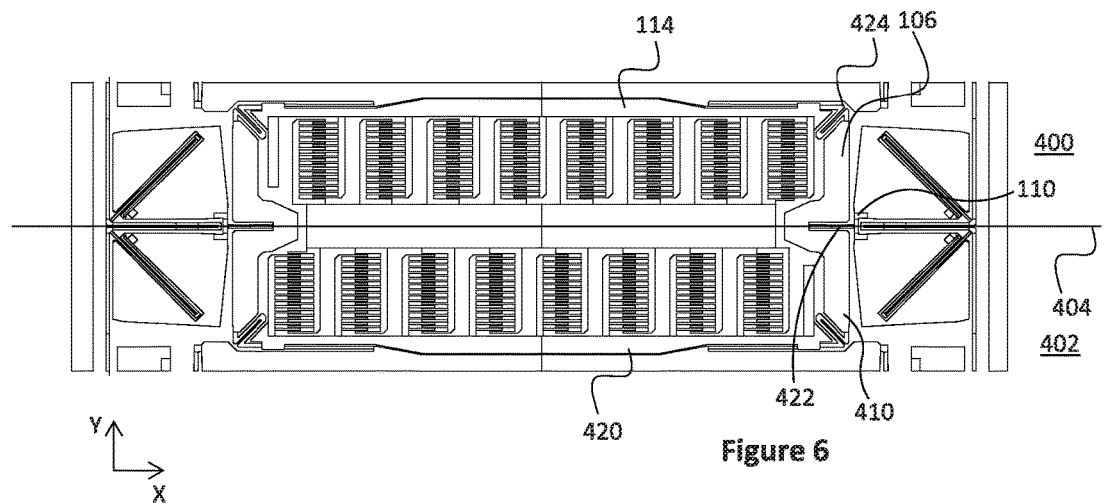
FIG. 6 a layer structure with two layer elements.

FIG. 6 illustrates a further embodiment where the layer structure includes a pair of first anchor points 110 aligned to the symmetry axis 404 between two layer elements 400, 402, as described in FIG. 4. In this case the symmetry axis 404 thus coincides with the drive axis. The third directional spring structure 106 for both layer elements 400, 402 includes a common rigid lever element 410 that has two ends. One end of the lever element 410 is coupled to the actuation body 114 of the first layer element 400, and the other end of the lever element 410 is coupled to the actuation body 420 of the second layer element 402. The lever element 410 is pivoted in the middle to the anchor point 110.

The coupling between the lever element 410 and the first anchor point 110 is arranged to allow see-saw type of motion of the lever element 410, in which the first anchor point 110 is a fulcrum. Accordingly, when one end of the lever element 410 moves in a positive X direction, the other end of the lever element 410 is forced to move in the negative X direction and vice versa. In the exemplary configuration of FIG. 6, the coupling between the lever element 410 and the first anchor point 110 includes a beam that extends from the first anchor point 110 in the symmetry axis 404 to an incorporated connection point 422 in a distance within the lever element. Other coupling types enabling such pivotal teeter-totter type of motion may be applied within the scope.

The coupling between the lever element 410 and the actuation bodies 114, 420 is arranged to interactively transfer the motion of the actuation body 114, 420 in X direction to the see-saw type of motion of the lever element 410, and vice versa. In the exemplary configuration of FIG. 6, the coupling between the lever element 410 and the actuation body 114 includes a diagonal spring 424 that interactively couples the weakly curvilinear path of the end of the lever element 410 and the linear motion of the actuation body 114. The diagonal spring X rigidly relays X direction components in motion of elements coupled by it, but deflects to eliminate possible Y direction components in the motion of the lever element 410. However, other coupling structures enabling the desired interactive transfer between the actuation elements and the lever element may be applied within the scope.

As shown in FIG. 6, the third spring structure advantageously includes two similar elements in both sides of the actuation bodies 114, 420. The see-saw type of motion of the lever element ensures coupling of the first layer element 400 and the second layer element 402 into anti-phase motion in the X direction. The symmetric arrangement cancels accelerations in the drive direction (X direction) induced by e.g. mechanical shocks or vibrations. A further advantage is that it keeps the drive motion and its spring constant linear. The third spring structure eliminates sense direction (Y direction) motion components from the primary motion, and keeps the spring constant of the actuation bodies 114, 420 stable with amplitude.

Figure 7:
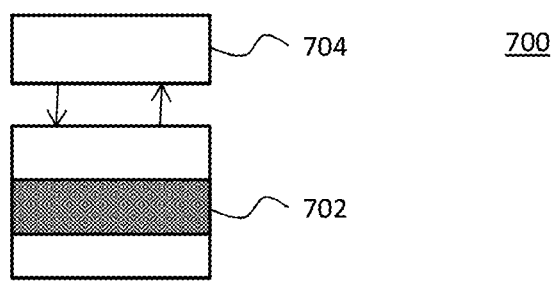
FIG. 7 illustrates a gyroscope that includes a layer structure.

FIG. 7 illustrates elements of a gyroscope device 700 that includes the layer structure 702 of FIG. 5. The layer structure 702 may be included in a microelectromechanical part that includes a substrate support and/or a covering cap layer. The gyroscope may include also an electrical circuit part 704 that is connected to input electrical signals from the microelectromechanical part and output electrical signals to it.

The microelectromechanical device may be included in a combined sensor element that includes a variety of sensor elements, a wired or mobile computing, gaming or communication device, a measurement device, a rendering device, or a vehicle function control unit, to name a few.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical gyroscope structure for detecting angular motion about an axis of angular motion, the structure comprising:
   a drive element suspended for one-dimensional motion in a direction of a drive axis, wherein the drive axis is orthogonal to the axis of angular motion;
   a sense body that carries one or more sense rotor electrodes and is coupled to the drive element with a first directional spring structure;
   wherein the first directional spring structure is configured to force the sense body to move in the direction of the drive axis with the drive element, and has a preferred direction of motion in a direction of a sense axis, wherein the sense axis is orthogonal both to the axis of angular motion and to the drive axis,
   wherein the drive element includes an actuation body and a drive frame wherein the first directional spring structure couples the sense body directionally to the drive frame,
   wherein the drive element includes a second directional spring structure that couples the drive frame to the actuation body and has a preferred direction of motion in a direction of the sense axis,
   wherein the actuation body carries one or more drive electrodes and is coupled to one or more first anchor points with a third directional spring structure that has a preferred direction of motion in a direction of the drive axis, and
   wherein the drive frame is coupled to one or more second anchor points with a fourth spring structure that has a preferred direction of motion in the direction of the drive axis.

2. The microelectromechanical gyroscope structure according to claim 1, further comprising a sense element including a sense stator and a sense rotor, wherein the sense rotor includes the sense body.

3. The microelectromechanical gyroscope structure according to claim 2, wherein the sense stator includes a stator comb and the sense rotor includes a rotor comb, wherein comb fingers of the stator comb and the rotor comb are interlaced.

4. The microelectromechanical gyroscope structure according to claim 1, wherein the drive element includes a drive stator and a drive rotor, wherein the drive rotor includes the actuation body.

5. The microelectromechanical gyroscope structure according to claim 4, wherein the drive stator includes a stator comb and the drive rotor includes a rotor comb, wherein comb fingers of the stator comb and the rotor comb are interlaced.

6. The microelectromechanical gyroscope structure according to claim 4, further comprising:
   a first layer element and a second layer element, each of which comprises the drive element and the sense element,
   wherein the first layer element and the second layer element are positioned symmetrically in respect of a symmetry axis such that sense bodies are in lateral ends of the layer elements.

7. The microelectromechanical gyroscope structure according to claim 6, wherein the third directional spring structure for the first layer element and the second layer element includes at least one common rigid lever element that has two ends;
   one end of the lever element is coupled to the actuation body of the first layer element, and the other end of the lever element is coupled to the actuation body of the second layer element;
   the lever element is pivoted in the middle to a first anchor point for a see-saw type of motion in which the first anchor point is a fulcrum.

8. The microelectromechanical gyroscope structure according to claim 7, wherein the third directional spring structure for the first layer element and the second layer element includes two common rigid lever elements, each lever element suspended to a separate first anchor point that coincides with the symmetry axis.

9. The microelectromechanical gyroscope structure according to claim 8, wherein each lever element is suspended to an anchor point with a beam spring that extends along the symmetry axis from the first anchor point to an incorporated connection point in a distance within the lever element.

10. The microelectromechanical gyroscope structure according to claim 8, wherein each lever element is coupled to the actuation body with a diagonal spring that interactively couples a weakly curvilinear part of an end of the lever element and the linear motion of the actuation body in the direction of the drive axis.

11. The microelectromechanical gyroscope structure according to claim 1, wherein the first anchor points include a pair of first anchor points positioned on opposite sides of the actuation body, and the drive axis coincides with a line connecting the pair of first anchor points.

12. The microelectromechanical gyroscope structure according to claim 11, wherein the third spring structure includes two springs oriented such that their deflection directions are aligned to a common axis that coincides with the drive axis.

13. The microelectromechanical gyroscope structure according to claim 12, wherein
   the second anchor points include a first pair of second anchor points positioned on opposite sides of the sense body, and wherein
   a line connecting the first pair of second anchor points is parallel to the drive axis.

14. The microelectromechanical gyroscope structure according to claim 13, wherein
   the second anchor points include a second pair of second anchor points positioned on opposite sides of the sense body, and wherein a line connecting the second pair of second anchor points is parallel to the drive axis and positioned between the drive axis and the line connecting the first pair of second anchor points.

15. A microelectromechanical gyroscope device that includes the microelectromechanical gyroscope structure of claim 1.

16. A microelectromechanical gyroscope structure, comprising:
   means for driving suspended for one-dimensional motion in a direction of a drive axis, said drive axis being orthogonal to an axis of angular motion;
   means for sensing motion, said means for sensing motion being coupled to the means for driving with means for a first directional spring and carrying one or more sense rotor electrodes,
   wherein the means for a first directional spring is for forcing the means for sensing motion to move with the means for driving in the direction of the drive axis, and has a preferred direction of motion in a direction of a sense axis, wherein the sense axis is orthogonal to the axis of angular motion and to the drive axis,
   wherein the means for driving includes means for actuation and a drive frame, wherein the means for a first directional spring couples the means for sensing directionally to the drive frame,
   wherein the means for driving includes means for a second directional spring for coupling the drive frame to the actuation body and has a preferred direction of motion in a direction of the sense axis,
   wherein the means for actuation carries one or more drive electrodes and is coupled to one or more first anchor points with means for a third directional spring that has a preferred direction of motion in a direction of the drive axis, and
   wherein the means for driving is coupled to one or more second anchor points with means for a fourth spring that has a preferred direction of motion in the direction of the drive axis.

17. The microelectromechanical gyroscope structure according to claim 16, further comprising means for a sense element including a sense stator and a sense rotor, the sense rotor including the means for a sense element.

18. The microelectromechanical gyroscope structure according to claim 17, wherein the sense stator includes a stator comb and the sense rotor includes a rotor comb, wherein comb fingers of the stator comb and the rotor comb are interlaced.

19. The microelectromechanical gyroscope structure according to claim 16, wherein the means for driving includes a drive stator and a drive rotor, wherein the drive rotor includes the means for actuation.

20. The microelectromechanical gyroscope structure according to claim 19, wherein the drive stator includes a stator comb and a drive rotor includes a rotor comb, wherein comb fingers of the stator comb and the rotor comb are interlaced.

* * * * *